United States Patent
Sahouria et al.

(10) Patent No.: US 7,716,624 B2
(45) Date of Patent: May 11, 2010

(54) MASK CREATION WITH HIERARCHY MANAGEMENT USING COVER CELLS

(76) Inventors: Emile Y Sahouria, 935 Eton Way, Sunnyvale, CA (US) 94087; Weidong Zhang, 350 Elan Village La., #103, San Jose, CA (US) 95134

( * ) Notice: Subject to any disclaimer, the term of this patent is extended or adjusted under 35 U.S.C. 154(b) by 460 days.

(21) Appl. No.: 11/438,031

(22) Filed: May 19, 2006

(65) Prior Publication Data
US 2006/0236299 A1 Oct. 19, 2006

Related U.S. Application Data

(63) Continuation of application No. 10/738,624, filed on Dec. 17, 2003, now Pat. No. 7,069,534.

(51) Int. Cl.
*G06F 17/50* (2006.01)
(52) U.S. Cl. .................. 716/18; 716/2; 716/11; 716/19
(58) Field of Classification Search .......... 716/2, 716/11, 18, 19
See application file for complete search history.

(56) References Cited

U.S. PATENT DOCUMENTS

| | | |
|---|---|---|
| 4,354,100 A | 10/1982 | Rohen |
| 4,714,920 A | 12/1987 | Andernach et al. |
| 4,791,283 A | 12/1988 | Burkhardt |
| 5,381,343 A | 1/1995 | Bamji et al. |
| 5,434,398 A | 7/1995 | Goldberg |
| 5,790,416 A | 8/1998 | Norton et al. |
| 6,047,116 A | 4/2000 | Murakami et al. |
| 6,056,785 A | 5/2000 | Chisaka |
| 6,077,310 A | 6/2000 | Yamamoto et al. |
| 6,154,874 A | 11/2000 | Scepanovic et al. |
| 6,173,435 B1 | 1/2001 | Dupenloup |
| 6,188,309 B1 | 2/2001 | Levine |
| 6,226,781 B1 | 5/2001 | Nistler et al. |
| 6,370,679 B1 | 4/2002 | Chang et al. |
| 6,415,421 B2 | 7/2002 | Anderson et al. |
| 6,425,113 B1 | 7/2002 | Anderson et al. |
| 6,425,117 B1 | 7/2002 | Pasch et al. |
| 6,453,452 B1 | 9/2002 | Chang et al. |
| 6,470,489 B1 | 10/2002 | Chang et al. |
| 6,560,766 B2 | 5/2003 | Pierrat et al. |
| 6,620,561 B2 | 9/2003 | Winder et al. |
| 6,637,010 B2 | 10/2003 | Yamamoto |
| 6,668,367 B2 | 12/2003 | Cobb et al. |

(Continued)

FOREIGN PATENT DOCUMENTS

JP    11-102380    4/1999

(Continued)

*Primary Examiner*—Thuan Do
(74) *Attorney, Agent, or Firm*—Klarquist Sparkman, LLP.

(57) ABSTRACT

A method and apparatus for translating a hierarchical IC layout file into a format that can be used by a mask writer that accepts files having a limited hierarchy. Cover cells of the original IC layout file or a modified file are designated, and the hierarchical file is redefined to include only those designated cover cells. Non-designated cover cells and other geometric data are flattened into the designated cover cells. The hierarchy of the modified file is then redefined to be less than or equal to the hierarchy limit of the mask writing tool.

24 Claims, 6 Drawing Sheets

U.S. PATENT DOCUMENTS

| | | |
|---|---|---|
| 6,728,946 B1 | 4/2004 | Schellenberg et al. |
| 6,901,574 B2 | 5/2005 | LaCour et al. |
| 6,931,613 B2 | 8/2005 | Kauth et al. |
| 6,951,004 B2 * | 9/2005 | Kamon ................. 716/11 |
| 7,017,141 B2 | 3/2006 | Anderson et al. |
| 7,069,534 B2 | 6/2006 | Sahouria et al. |
| 7,155,689 B2 | 12/2006 | Pierrat et al. |
| 7,172,838 B2 | 2/2007 | Maurer et al. |
| 7,174,531 B2 | 2/2007 | Schellenberg et al. |
| 7,240,321 B2 | 7/2007 | Cobb et al. |
| 7,412,675 B2 | 8/2008 | Kauth et al. |
| 2003/0005400 A1 | 1/2003 | Karniewicz |
| 2004/0128643 A1 | 7/2004 | Buechner et al. |
| 2006/0005154 A1 | 1/2006 | Cobb et al. |
| 2007/0198967 A1 | 8/2007 | Ren et al. |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/97096 | 12/2001 |

* cited by examiner

MASK CREATION WITH HIERARCHY MANAGEMENT USING COVER CELLS

CROSS-REFERENCE TO RELATED APPLICATION

The present application is a continuation of U.S. patent application Ser. No. 10/738,624, filed Dec. 17, 2003, the benefit of which is claimed under 35 U.S.C. §120.

FIELD OF THE INVENTION

The present invention relates generally to photolithographic processing and in particular to methods and apparatus for creating files that describe devices to be created with one or more photolithographic masks/reticles.

BACKGROUND OF THE INVENTION

The vast majority of all complex integrated circuits (ICs) are created by circuit designers using computers. Most circuit designers use computer programs to define the functionality required of the circuit and the computer analyzes the functionality requested in order to create the electronic equivalent of a circuit diagram.

To convert the designer's intent into a physical, integrated circuit, other computer programs take libraries of cells representing groups of transistors and other low level circuit components that provide the desired functionality, determine locations for these components, and construct the wiring necessary to interconnect them. Such a tool is often called a "place and route tool." Custom design tools also exist to provide other methods to craft complete IC layouts. Once all the electronic devices have a physical representation, it is expected that the physical circuit will deliver the specified electrical performance. The layers of the layout data are fabricated as a set of masks/reticles that are used in the photolithographic processing of the actual circuits themselves.

Before translating the IC layout data into a format for use by a photolithographic mask or reticle writing tool, the IC layout data are often analyzed by one or more other computer programs to ensure that no design rules have been broken during the creation of the IC layout data and/or to correct for errors that can occur during the photolithographic printing process.

One example of such a program is the Calibre® program produced by Mentor Graphics Corporation of Wilsonville, Oreg., the assignee of the present application. The Calibre™ program is a suite of tools that operate on the IC layout data. These tools include a design rule checking (DRC) program that ensures the compliance with a number of design rules particular to the manufacturing process to be used. For example, a design rule can specify a particular tolerance such as "no transistors can be located within x microns of other transistors," etc. In addition, the Calibre® program can perform optical process correction (OPC) to compensate the layout for distortions that are likely to occur during the printing of the photolithographic mask or reticle. Calibre® can also perform phase shift mask (PSM) modifications that add phase shifters to the mask or reticle in order to enhance contrast between features or add subresolution features on an integrated circuit.

After verifying and/or correcting the layout data, the data are translated into a format that can be utilized by a mask or reticle writing tool. Examples of such formats are MEBES, for raster scanning machines manufactured by ETEC, an Applied Materials Company, ".MIC" format from Micronics AB in Sweden for their mask writers, and various vector scan formats for Nuflare, JEOL, and Hitachi machines. Once written, the masks or reticles are then used in a photolithographic process to expose selected areas of a silicon wafer in order to produce the integrated circuit components on the wafer.

Many mask writing tools require file formats that are "flat," wherein each object to be created on a mask is separately defined in the file. Computer files written in a flat format containing the corrected IC layout data can be enormous. For example, one IC layout data file for a single layer of a field programmable gate array can be approximately 58 gigabytes long. The time required to transmit a file of this size to a mask or reticle writing tool with standard network protocols can exceed 60 hours. When such large files are transmitted over communication networks, the risk that an error will occur during transmission rises with the length of the file transmitted. In addition, the time required to transmit the data file can be longer than the time required for the mask or reticle writer to produce a mask or reticle from the file. Therefore, the mask writing tool is inefficiently used when the data files are too large.

To speed processing, some mask writers are accepting IC layout file formats that have a limited number of hierarchy levels permitted. Instead of requiring a separate description of each placement of an object to be created on a mask, a hierarchical file can include reference to objects or groups of objects that are placed at more than one location on the mask. This hierarchical description of objects to be created saves considerable memory and improves processing time. Calibre® uses a hierarchical database to analyze IC layout files. For example, the layout format GDS-II has no limit on the number of hierarchy levels permitted. Despite the advantages of a hierarchical description, most mask writing tools do not allow as many levels of hierarchy as an IC verification program. Typical mask writers may only allow a few levels of hierarchy. Therefore, the IC layout files must be converted to a format that can be used by a mask writing tool. If the conversion is not done efficiently, however, many of the advantages of the original hierarchy can be lost.

Given these problems, there is a need for an improved method of translating hierarchical IC layout data into a format having fewer levels of hierarchy such as for use by a photolithographic mask or reticle writing tool in a manner that reduces file size, improves processing speed and retains at least some of the advantages of the original hierarchical description.

SUMMARY OF THE INVENTION

A system and method for translating a hierarchical IC layout file into a format that can be used by a mask writer that accepts hierarchical files of limited depth. The system designates cover cells from the original or modified hierarchical data and extends the designated cover cells to include the geometric data and the cells that were not designated to create a modified hierarchical file. The hierarchy of the modified file is then selectively redefined such that it meets the depth requirements of the mask writer.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1A:
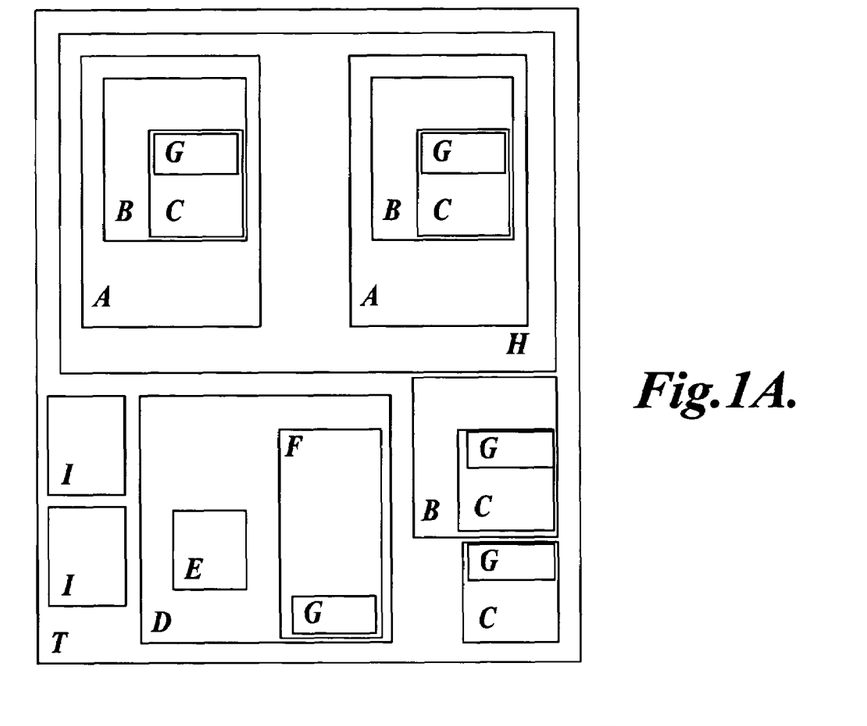
FIGS. 1A-1B illustrate a simplified IC layout and its corresponding hierarchical graph.

As indicated above, the present invention is a method and apparatus for redefining the hierarchy of an IC layout data file in order to comply with the file requirements of a mask writer or other tool. The IC layout data file can be in any of a number of standard formats such as GDS-II, OASIS, CIF or a previously fractured file such as MEBES or other format used by a mask writer. FIG. 1A shows a simplified integrated circuit layout including a plurality of cells A, B, C . . . . I that are defined within a top cell T. Each cell can include collections of individual geometries to be formed on a mask/reticle as well as references to other such collections. As can be seen, the top cell T includes placements of larger cells D and H that in turn include placements of repeated cells B. Each instance of Cell B includes a placement of a repeated cell G.

Figure 1B:
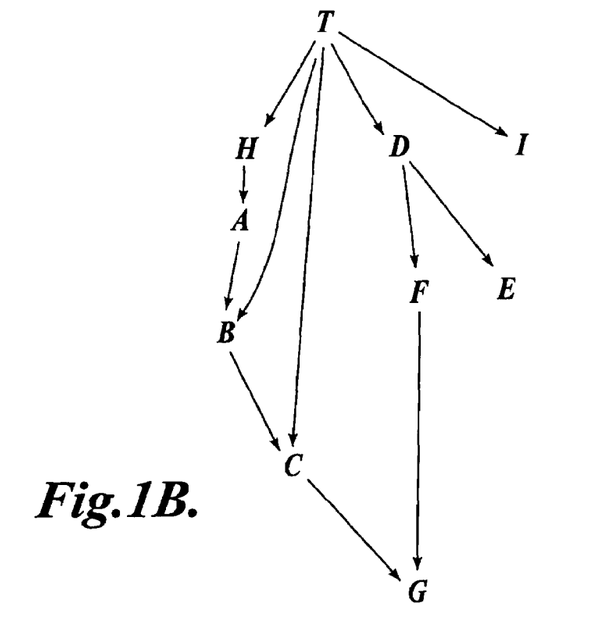

FIG. 1B illustrates a hierarchical graph that represents the relationship between the top cell T and the cells A-I of the layout shown in FIG. 1A. Each cell referenced by the top cell T has a maximum depth represented by the longest path that extends between the top cell T (defined at level zero) and the cell in question. For example, cell B has a depth of three if referenced through cells A and H, or a level of one if referenced directly from the top cell T. Therefore, cell B has a maximum hierarchical depth of three. Similarly, cell G has a maximum hierarchical depth of five since the longest reference path is through cells H, A, B, C.

In many instances, the hierarchical graph used to describe the IC layout data has more levels than can be accepted by the mask writing tool that will create the corresponding masks/reticles in order to fabricate the IC layout data on a silicon wafer. Therefore, the hierarchical graph must be transformed to comply with the requirements of the mask writing tool. Many mask writing tools will only accept flat files, wherein each object to be created on the mask must be separately defined in the file. However, some new mask writing formats will accept limited levels of hierarchy, such as up to 10 levels of hierarchy, etc.

Figure 2A:
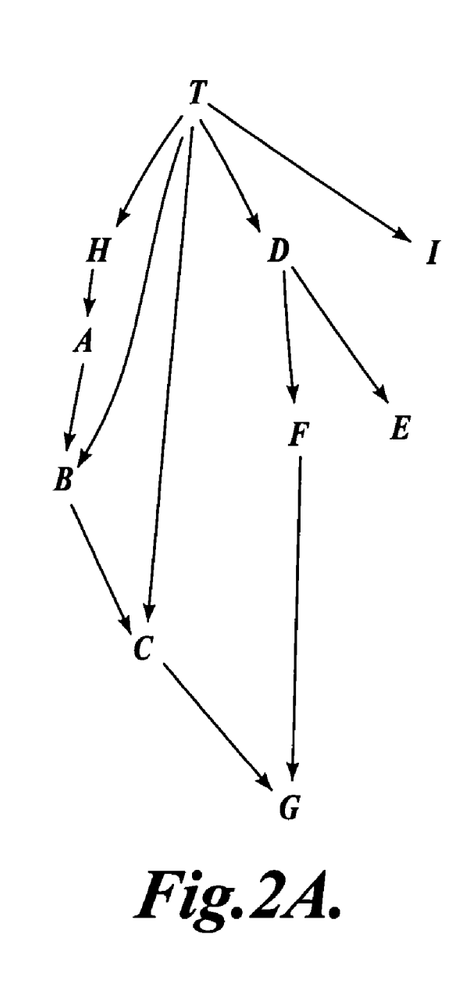
FIGS. 2A-2C illustrate one method of redefining the depth of a hierarchical graph to comply with the maximum file depth requirements of a mask writing tool.
Figure 2B:
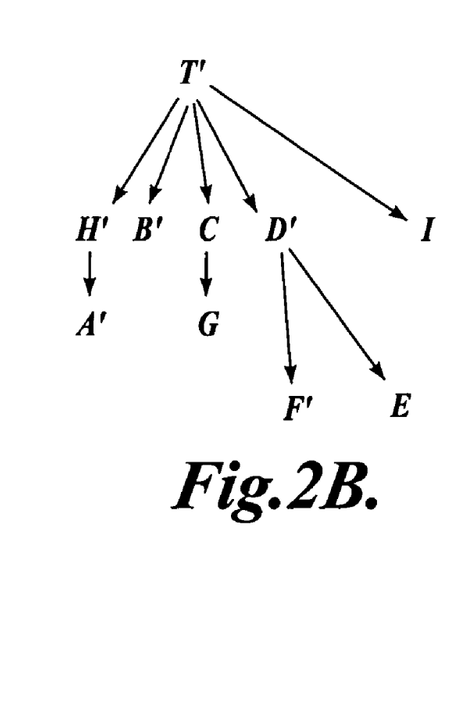
Figure 2C:
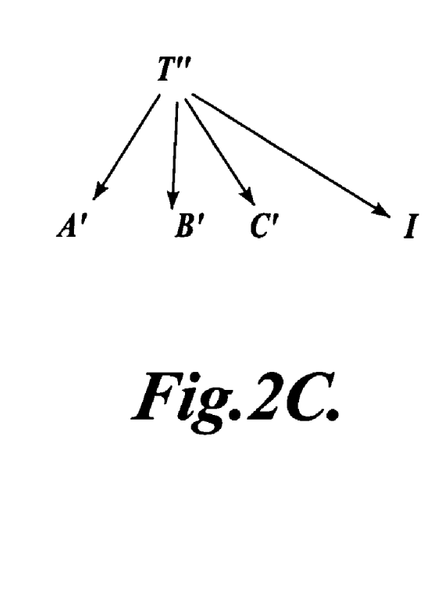

FIGS. 2A-2C illustrate one simplistic method of redefining the hierarchy of the integrated circuit layout data to a format that is acceptable to the mask writing tool. The original IC layout hierarchical graph shown in FIG. 2A is compressed by first flattening deep placements of cells within the hierarchy. The notation A' designates the cell A that has been modified etc. In the example shown, the original hierarchy has a maximum depth of five, and the graph shown in FIG. 2B is modified such that all placement of cells with a depth greater than a maximum depth limit of two are flattened as shown in FIG. 2B. Furthermore, any unacceptable cells can be expanded into their parent cells thereby producing the resulting hierarchical graph as shown in FIG. 2C. Expanding a placement of a cell typically entails replacing the reference to the cell with the contents of the cell—geometry and child placements—transformed to the correct location. What constitutes an unacceptable cell is usually defined by criteria dictated by the mask writing tool and can depend on such factors as the geometric area occupied by a cell or the memory required to describe a cell. For example, if the geometric area of a cell is too big, the beam deflection mechanism of the mask writing tool may not be able to produce the cell in a single step.

While the hierarchical data graph shown in FIG. 2C meets the requirements of a mask writing tool having a maximum of two levels of hierarchy permitted, many of the advantages of the original cell hierarchy can be lost.

A better way of redefining the hierarchy of the original IC layout data to comply with a format that is acceptable to the mask writer involves the careful designation of cover cells used to represent the data in the hierarchy. The cover cells should be designated to minimize the mask writer operation time as well as minimize the time required to create the modified data. Furthermore, depending upon the requirements of the mask writer, the mask writer input file size should be minimized, and the specifications and recommendations for the format for cells in their placements should be followed.

In one embodiment of the invention, each of the cells in the IC layout data are ranked according to the geometric area occupied by the combined placement of each of the cells and the number of times a cell occurs in the layout.

If the designated cells are too small, the time required to write all the placements of the cells on the mask increases. On the other hand, if the memory required to store a description of a designated cell is too large, then the time to transfer its description to the mask writing tool is too long. Finally, the area occupied by the selected cells on the mask should be maximized to reduce redundant geometry and the corresponding file size and processing time. It is against these competing criteria that cover cells of the IC layout are designated.

The set of cells that best meets these criteria may be optimally designated by considering every set of cells of every possible size. This exact method may be computationally time-consuming. Approximation methods may therefore be used but run the risk of designating a suboptimal set. In practice, the approximate methods set forth in the described embodiment of the invention, work very well, often as well as the exact method, and with much less computation.

One such approximate method of designating cells is to evaluate each cell in accordance with a cost function. In an actual embodiment of the invention, the cost function is set forth in Equation 1:

$$Mi = K \cdot \frac{Ci}{\text{area left}} + \exp\left(-\left|\frac{\frac{Ai}{\text{chiparea}} - M}{S}\right|\right) \quad (1)$$

where "Mi" is the cost function result of a given cell, "Ci" is the coverage for the cell, i.e., the total area occupied by all instances of the cell within the integrated circuit. The term "chip area" refers to the total area of the integrated circuit. The term "area left" is the chip area less the area occupied by any previously selected cells. The term "Ai" is the area of an individual instance of the cell under consideration. Cell area may be measured as simply the size of the rectangular extent of the cell. A more accurate measurement reflects the area of the cell not overlapped by other cell placements in any of its placements ("template-specific area"), and the geometrical complexity of the data within that area. The term "M" represents an ideal cell area, which, in one embodiment of the invention, is about ¹⁄₂₅₀ of the area of the integrated circuit and the term "S" characterizes the useful range of cell area values around M.

Each cell in the IC layout is given a score for the cost function and the highest scoring cells are designated as the selected cover cells.

The following is a pseudo-code listing of a computer program that implements the selection of cover cells according to the cost function set forth in Equation 1.

Inputs: - - -
hierarchical database Contains geometry, overlap areas, and the hierarchy.
Algorithm: - - -

```
// First, allocate storage space for various values for each cell.
AllocateArray a[ ];        // Template specific area for each cell.
AllocateArray n[ ];        // Number of flat placements of each cell.
AllocateArray c[ ];        // "Coverage" for each cell.
// Compute initial values for a[ ] and c[ ].
for each (cell in database) {
    a[i] = EXTENT(cell) - OVERLAP_AREA(cell); // The
    template-specific area.
    n[i] = number of flat placements of cell (from database);
    c[i] = n[i] * tsArea;
}
// Next, cover the chip area with placements of individually selected cells.
// After each cell is selected, update the area and placement count records
// for all remaining (not yet selected) cells.
stop = false;
areaLeft = total chip area;
coverCells = { };
while (stop == false) {
    maxScore = 0;
    maxCell = 0;
    nTotal = 0;
    NL = 4; NU = 300;   // Empirically chosen constants.
// The cell mark is a general purpose database flag.
    for each (cell in database) {
        if (NL <= n[cell] <= NU) clear cell mark;
        else set cell mark;
    }
    for each (unmarked cell in database) {
        m = Score(c[cell], a[cell], areaLeft);
        if (m > maxScore) {
            maxScore = m;
            maxCell = cell;
        }
    }
    coverCells = coverCells UNION {maxCell};
    nTotal = nTotal + n[cell];
    areaLeft = areaLeft - c[cell];
    UpdateCoverage(c, a, maxCell, database);
    stop = UpdateStop(areaLeft, nTotal, maxCell);
}
// The coverage score function.
Score (ci, ai, areaLeft) {
    // Empirically chosen constants.
    K = 2;
    M = 0.004;
    S = 0.01;
    return (K * (ci/areaLeft) + exp {-(|ai/chipArea- M|) / S};
}
// The stopping condition update function.
UpdateStop (areaLeft, n, maxCell) {
    // Empirically chosen constants.
    MAX_COVER = 40;
    MAX_PLACEMENTS = 400;
    AREA_LEFT = 0.05
    // Stop if the number of selected cells is too large, the number
    // of total placements is too large, or enough area has been covered.
    return true if ((|coverCells| > MAX_COVER) OR
                    (nTotal > MAX_PLACEMENTS) OR
                    (areaLeft/chipArea < AREA_LEFT));
    else return false;
}
// The coverage update function.
UpdateCoverage (c, a, coverCell, database) {
    // First, mark cells that contain the chosen cover cell.
    // Disqualify these cells as future cover cells.
    // "Previous" means previous in the topological sort sense.
    // Alternatively, one could modify a[i] to account for
    // placements of the cover cell, but that is less efficient.
    mark (coverCell);
    for (currentCell = coverCell->previous; currentCell != TOPCELL;
                currentCell = coverCell->previous) {
        if (any placement of currentCell is marked) mark(currentCell);
    }
    // Now reduce coverage for cells that have placements in the
    // cover cell.
    // "Next" means next in the topological sort sense.
    AllocateArray nn[ ]; // Number of placements of each cell in the
    cover cell.
    initialize nn[ ] to zero;
    for (currentCell = coverCell->next; currentCell != BOTTOM;
                currentCell = currentCell->next) {
        for each (placement in currentCell) {
            nn[placement's cell] += nn[currentCell];
        }
    for each (cell in database) {
        c[cell] -= nn[cell] * n[coverCell];
    }
}
```

Although any cell is suitable for consideration as a designated cover cell, performance enhancements can be made by only considering cells that are repeated more than some minimum number of times in the layout and less than a maximum number of times in the layout. In one embodiment, the minimum number of times a cell must be repeated to be considered is 4 and the maximum number of times a cell can be repeated is several hundred.

Although one embodiment of the invention utilizes the cost function described above, it will be appreciated that there are other ways to designate cover cells. For example, cover cells could be designated based on size alone, such as any cell having ¹⁄₂₀₀th area of the integrated circuit could be used. Alternatively, density of a cell could be used. Cells having a greater density of polygons take more time to transmit, so redundant cells having a relatively large area and high density could be selected. Manual selection could also be used.

Cover cells can be defined by creating copies of the original cells, modifying original cells such as by flattening or modifying the subhierarchy of a cell and/or partitioning it into smaller cells or both. New cells can also be derived from the layout geometry such as by combining commonly recurring patterns of polygons or groups of polygons that can be recognized and represented by a cell placement or combination of these methods. Added cells can be thought of as new cells added to the hierarchy before cover cell designation.

Figure 3A:
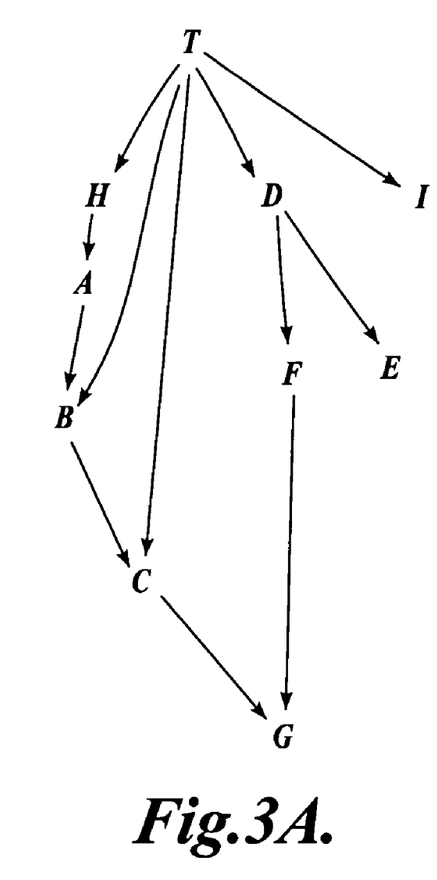
FIGS. 3A-3C illustrate a method of redefining a hierarchical graph with selected cover cells in accordance with one aspect of the present invention.
Figure 3B:
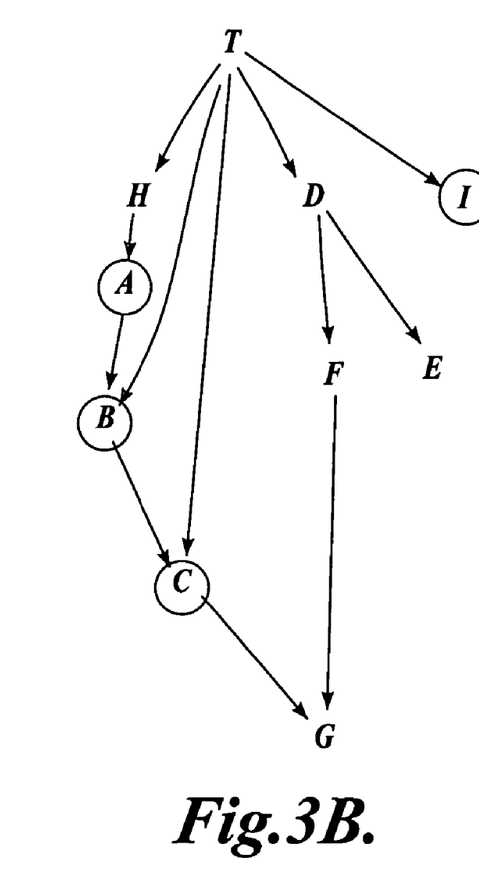
Figure 3C:
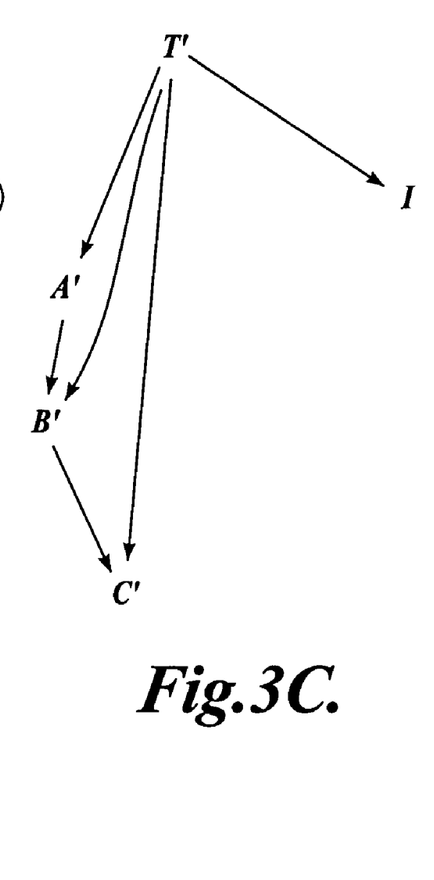

FIG. 3B illustrates a graph of the original IC layout data with cells A, B, C, and I selected as acceptable cover cells. In addition, the top cell T is included as a catch-all cover cell. Once the cover cells are designated, the hierarchical graph is redefined so that only these cover cells remain as shown in FIG. 3C. The cover cell C becomes cell C' by incorporating the cells and geometry located in the referenced cell G. Cover cell B becomes cell B' by referencing the new cell C'. Cell A becomes cell A' by referencing the new cell B' and the top cell T becomes cell T' by referencing the new cells A', B', and C'.

FIG. 3A illustrates the hierarchical graph defined solely in terms of the selected cover cells. Each of the designated cover cells meets the requirements for cover cells determined by the mask writing tool.

The redefined hierarchical graph may have a depth that is greater than the maximum depth the mask writer allows. Therefore, the hierarchical graph must be redefined so that no cell placement has a depth greater than the format limit.

Figure 4A:
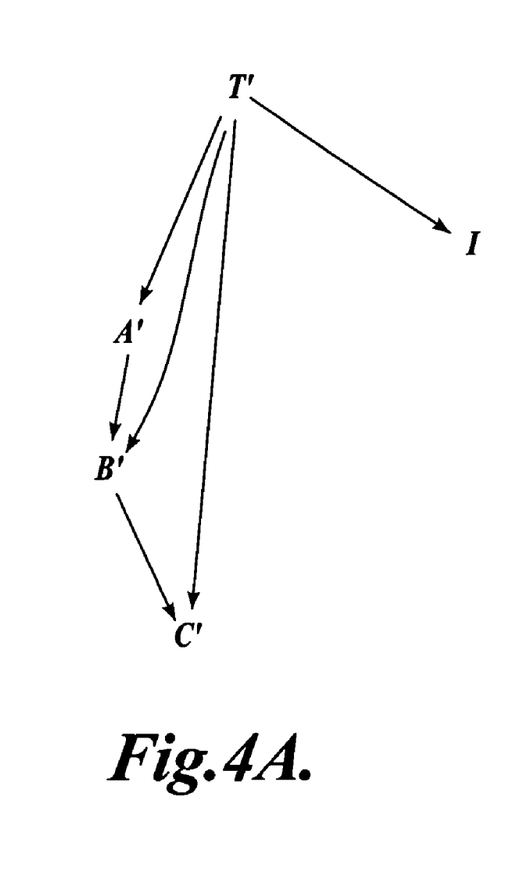
FIGS. 4A-4C illustrate a method of expanding designated cover cells to comply with maximum file depth requirements of a mask writing tool in accordance with another aspect of the present invention.
Figure 4B:
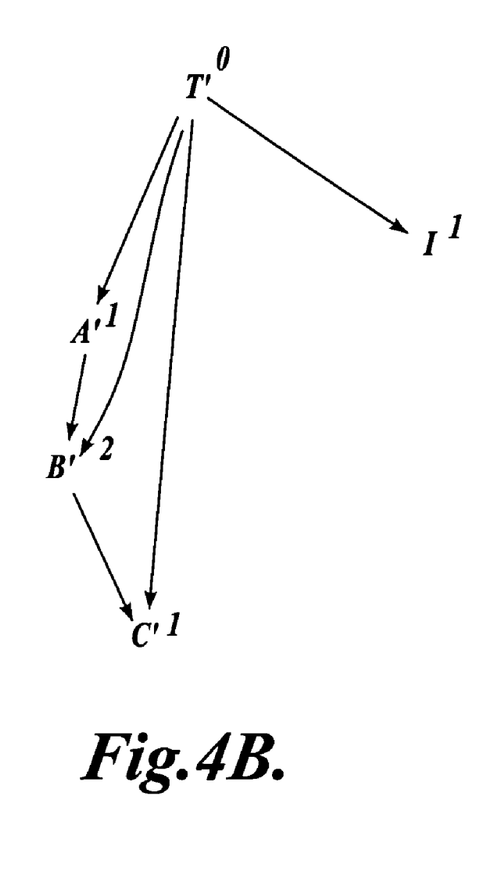

One technique, according to an embodiment of the present invention, for redefining the depth of the hierarchical graph is to determine a maximum placement depth for each cell that is not greater than the hierarchical depth limit "L" that is specified by the mask writing tool. For the purpose of the present specification, this depth is called max_depth. As shown in FIG. 4B, assuming a depth limit of L=2 for the mask writer, the cell B' has a depth of 2 if referenced through cell A' and a depth of 1 if referenced through the top cell T'. Therefore, the max_depth for cell B is 2. Cell C' has a depth of 3 if referenced through cover cells A' and B' and a depth of 1 if referenced from the top cell T'. Because depth 3 exceeds the depth limit L=2, cell C' has a max_depth of 1.

Once the maximum placement depth not greater than L is calculated for each cover cell, a topological sort of the hierarchical graph is made. This is a list of the cover cells ordered such that no cell is seen before any of its parents. The list is then analyzed in the reverse order, i.e., starting with the lowest depth cover cell and working toward the top cell. For each cover cell in the list, any placement of a subgraph for that cell is expanded if the placement has a depth greater than L-max_depth in the subgraph. For example, cover cell C' has an empty subgraph. Therefore, the cover cell C' does not need to be modified. Cover cell B' has a max_depth of 2 and L-max_depth=2-2=0. Therefore, any subgraph for cell B' can have a depth no greater than 0. A placement of cell C' has a depth 1 in this subgraph. Therefore, this placement of cell C' is expanded into its parent cell B' to produce cover cell B" and parent cover cell T."

Figure 4C:
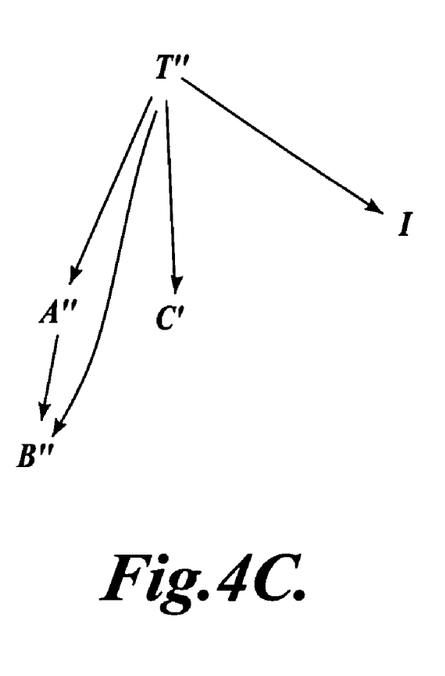
Figure 5A:
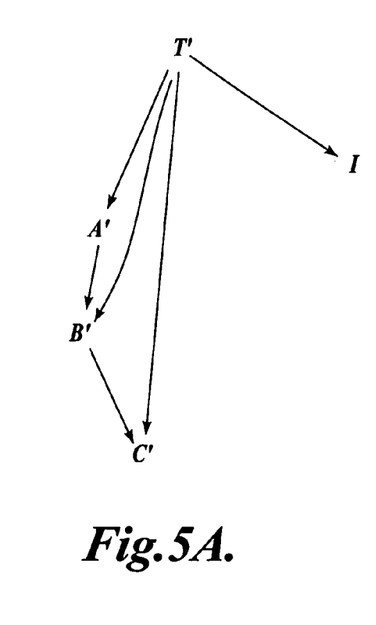
FIGS. 5A-5D illustrate an alternative method of redefining the hierarchy of a hierarchical graph in accordance with another aspect of the present invention.
Figure 5B:
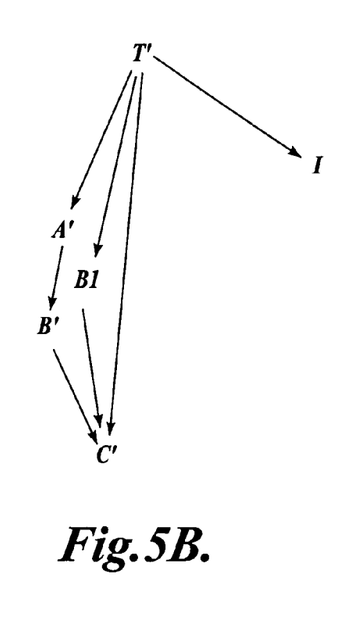
Figure 5C:
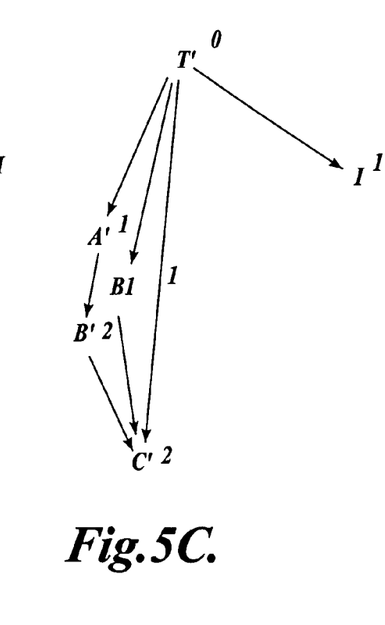
Figure 5D:
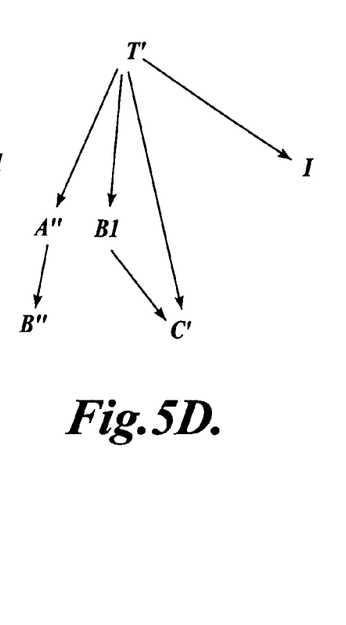

The resulting hierarchical graph shown in FIG. 4C is likely to be more efficient in terms of the time required to transfer to the mask writing tool and the operation of the mask writing tool itself because the cover cells are selected according to the criteria set forth above.

FIGS. 5A-5D illustrate another method of redefining the hierarchy of a hierarchical graph. In the hierarchical refinement to achieve a depth reduction, it is also possible to duplicate cover cells to avoid expanding all placements of a cell. For instance, in FIGS. 5A-5D, one can duplicate cell B (making cell B1) and place the copy in one of the placements, effectively making it a different cell. After expanding placements of noncover cells, the cell B1 has a subgraph of acceptable depth while the other placements of cell B must be expanded. Thus only cell B must be expanded. This may improve the hierarchical impression of the final file.

Figure 6:
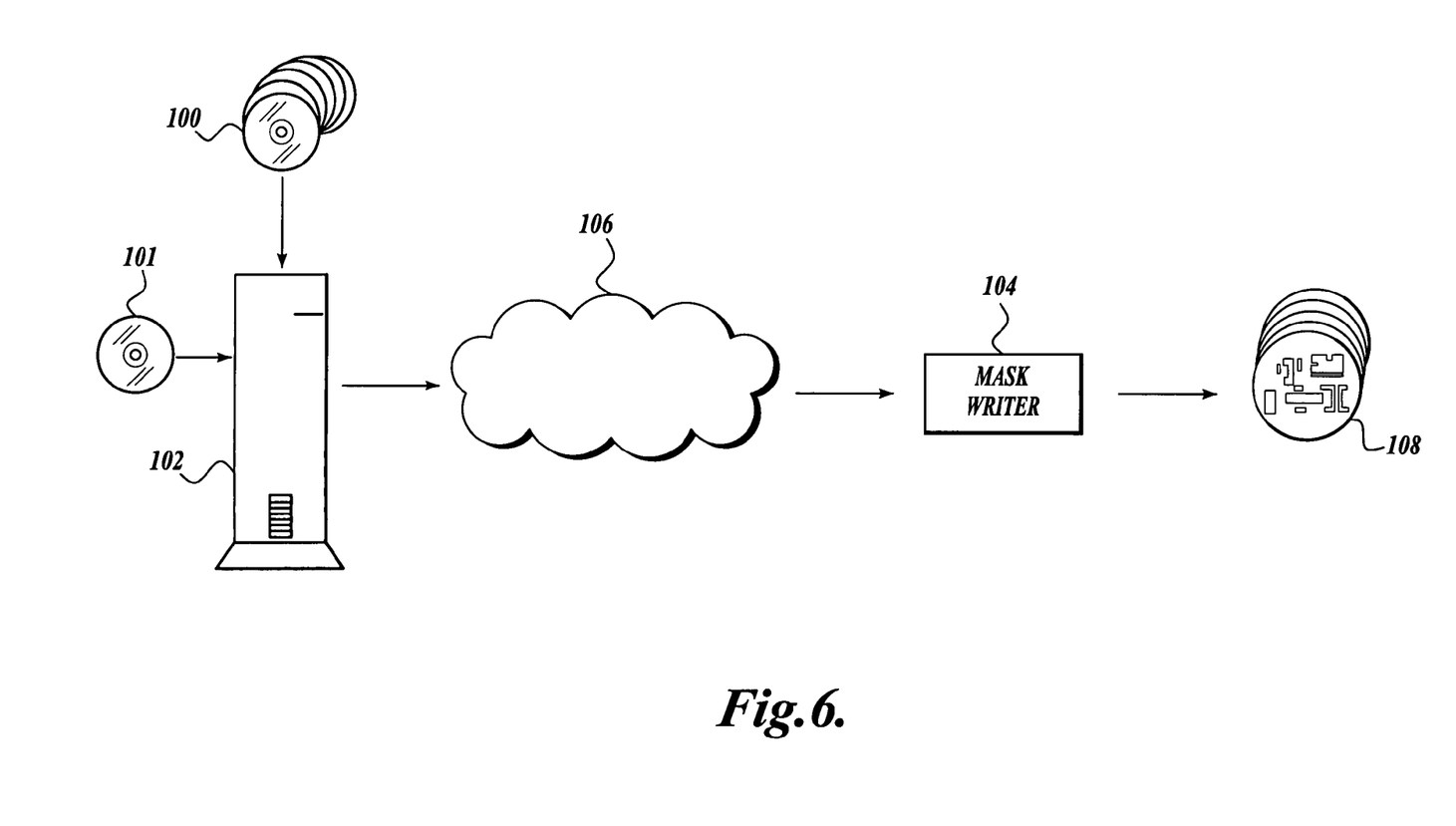
FIG. 6 illustrates an exemplary system for implementing an embodiment of the present invention.

FIG. 6 illustrates one possible system for producing the redefined hierarchical graph in accordance with the present invention. An IC layout file 100 is received on one or more computer readable media 100 or via a wired or wireless data communication link by a stand-alone or distributed computer system 102. The computer system 102 reads a data storage medium 101 such as a CD or internal hard drive having stored thereon a sequence of program instructions that cause the computer system 102 to perform the cover cell designation and redefinition of the hierarchical graph to have a depth no greater than a defined depth limit. In one embodiment, the computer system 102 copies the IC layout file into RAM memory and makes copies of the cell descriptions within the RAM memory. The copies of the cell descriptions are modified as described above and stored on a computer readable media without overwriting the original cell descriptions to create the redefined hierarchical graph file. The computer system then transmits the redefined hierarchical graph file to a mask writer 104. The data may be transmitted over a wired or wireless communication link 106 or may be transferred onto computer readable media such as CD's, DVDs, magnetic tape or other formats. The mask writer 104 produces one or more masks or reticles 108 corresponding to the IC layout data provided. The computer system 102 and the mask writer 104 may be located in the same country or in different countries.

While the preferred embodiment of the invention has been illustrated and described, it will be appreciated that various changes can be made therein without departing from the scope of the invention. For example, the cover cell designation and hierarchy refinement can be performed with any cell of a hierarchy graph defined as a top cell T. Alternatively, an IC layout file could be divided into geographical regions and each region analyzed independently.

Therefore, it is intended that the scope of the invention be determined from the following claims and equivalents thereof.

The embodiments of the invention in which an exclusive property or privilege is claimed are defined as follows:

1. A computer-readable storage medium storing a sequence of program instructions that causes a computer to perform a method, the method comprising:
   designating one or more cells in a hierarchical description as cover cells, wherein the hierarchical description represents an integrated circuit layout;
   generating a rank order for the cover cells in the hierarchical description; and
   redefining the hierarchical description by analyzing the cover cells and incorporating data from one or more of the cover cells into their respective parent cells, wherein the redefining is performed according to the rank order.

2. The computer-readable storage medium of claim 1, wherein the method further comprises incorporating data from one or more noncover cells into the cover cells.

3. The computer-readable storage medium of claim 1, wherein the generating a rank order comprises ranking the at least some of the cover cells so that cover cells having a lower hierarchical depth are analyzed before cover cells having a higher hierarchical depth during the redefining.

4. A computer-readable storage medium storing integrated circuit layout data created by executing the program instructions stored in the computer-readable storage medium of claim 1.

5. A computer-readable storage medium storing a sequence of program instructions that causes a computer to perform a method, the method comprising:
   designating one or more cells in a hierarchical description as cover cells, wherein the hierarchical description represents an integrated circuit layout;
   generating a rank order for the cover cells in the hierarchical description; and
   redefining the hierarchical description by analyzing the cover cells and incorporating data from one or more of the cover cells into their respective parent cells, wherein the redefining is performed according to the rank order, and wherein the redefining comprises:
      determining if a respective cover cell has a hierarchical depth that exceeds a hierarchical depth limit; and
      incorporating data from the respective cover cell into its respective parent cell if the hierarchical depth exceeds the hierarchical depth limit.

6. A computer-readable storage medium storing a sequence of program instructions that causes a computer to perform a method, the method comprising:

ranking a plurality of cells in a hierarchical description, wherein the hierarchical description represents an integrated circuit layout;

designating one or more of the cells in the hierarchical description as cover cells, the identity of the cells designated as cover cells being based at least in part on the ranking; and redefining the hierarchical description to reduce the hierarchical depth of the hierarchical description, wherein the redefining comprises incorporating data from one or more noncover cells into respective ones of the cover cells.

7. The computer-readable storage medium of claim 6, wherein the ranking comprises using a cost function referencing data for at least one of the cells.

8. The computer-readable storage medium of claim 7, wherein the data referenced by the cost function for a respective cell comprises one or more of total coverage area of the respective cell, area left, area of an individual instance of the respective cell, template-specific area of the respective cell, geometrical complexity of the respective cell, area of the integrated circuit layout, or a ratio of the area of the respective cell to the area of the integrated circuit layout.

9. A computer-readable storage medium storing integrated circuit layout data created by executing the program instructions stored in the computer-readable storage medium of claim 6.

10. The computer readable storage medium of claim 6, wherein the method further comprises generating a rank order for the cover cells in the hierarchical description, and wherein the redefining the hierarchical description is performed according to the rank order.

11. A method comprising:

ranking a plurality of cells in a hierarchical description, wherein the hierarchical description represents an integrated circuit layout;

with a computer, designating one or more of the cells in the hierarchical description as cover cells, the identity of the cells designated as cover cells being based at least in part on the ranking;

redefining the hierarchical description to reduce the hierarchical depth of the hierarchical description, wherein the redefining comprises incorporating data from one or more noncover cells into respective ones of the cover cells; and storing the redefined hierarchical description in a computer-readable storage medium.

12. The method of claim 11, wherein the redefining further comprises:

generating one or more copies of a parent cover cell of the cover cells; and incorporating data from the cover cells into one or more but not all of the parent cover cell or the copies of the parent cover cell.

13. The method of claim 11, wherein the method further comprises deriving new cells in the hierarchical description by recognizing a group of layout data that recurs in the integrated circuit layout and representing the group as a new cell.

14. The method of claim 11, wherein the ranking is performed using at least in part a cost function for a respective cell, wherein the cost function comprises one or more of total coverage area of the respective cell, area left, area of an individual instance of the respective cell, template-specific area of the respective cell, geometrical complexity of the respective cell, area of the integrated circuit layout, or a ratio of the area of the respective cell to the area of the integrated circuit layout.

15. The method of claim 11, wherein the method further comprises creating a mask or reticle using the redefined hierarchical description.

16. The method of claim 11, wherein the method further comprises creating an integrated circuit using a mask or reticle created using the redefined hierarchical description.

17. The method of claim 11, wherein the method further comprises transmitting the hierarchical description to a remote computer system that performs the acts of the ranking the plurality of cells, the designating one or more cells as cover cells, and the redefining the hierarchical description.

18. A method comprising:

designating one or more cells in a hierarchical description as cover cells, wherein the hierarchical description represents an integrated circuit layout;

with a computer, generating a rank order for the cover cells in the hierarchical description;

redefining the hierarchical description by analyzing the cover cells and incorporating data from one or more of the cover cells into their respective parent cells, wherein the redefining is performed according to the rank order; and storing the redefined hierarchical description in a computer-readable storage medium.

19. The method of claim 18, further comprising incorporating data from one or more noncover cells into the cover cells.

20. The method of claim 18, wherein the generating a rank order comprises ranking the at least some of the cover cells so that cover cells having a lower hierarchical depth are analyzed before cover cells having a higher hierarchical depth during the redefining.

21. The method of claim 18, further comprising:

determining if a respective cover cell has a hierarchical depth that exceeds a hierarchical depth limit; and incorporating data from the respective cover cell into its respective parent cell if the hierarchical depth exceeds the hierarchical depth limit.

22. The method of claim 18, further comprising creating a mask or reticle using the redefined hierarchical description.

23. The method of claim 18, further comprising creating an integrated circuit using a mask or reticle created using the redefined hierarchical description.

24. The method of claim 18, wherein the method further comprises transmitting the hierarchical description to a remote computer system that performs the acts of the designating one or more cells as cover cells, the generating the rank order, and the redefining the hierarchical description.

* * * * *